United States Patent
Takei

(10) Patent No.: US 9,461,353 B2
(45) Date of Patent: Oct. 4, 2016

(54) POWER COMBINER AND POWER DIVIDER

(71) Applicant: DAIHEN CORPORATION, Osaka (JP)

(72) Inventor: Hirotaka Takei, Osaka (JP)

(73) Assignee: DAIHEN CORPORATION, Osaka (JP)

(*) Notice: Subject to any disclaimer, the term of this patent is extended or adjusted under 35 U.S.C. 154(b) by 0 days.

(21) Appl. No.: 14/217,790

(22) Filed: Mar. 18, 2014

(65) Prior Publication Data
US 2014/0292441 A1 Oct. 2, 2014

(30) Foreign Application Priority Data

Mar. 29, 2013 (JP) .................................. 2013-070842

(51) Int. Cl.
| | | |
|---|---|---|
| H01P 5/12 | (2006.01) | |
| H01P 5/16 | (2006.01) | |
| H03H 7/48 | (2006.01) | |

(52) U.S. Cl.
CPC . H01P 5/16 (2013.01); H01P 5/12 (2013.01); H03H 7/48 (2013.01)

(58) Field of Classification Search
CPC .............. H01P 5/16; H01P 5/12; H03H 7/48
USPC ........................................................ 333/125
See application file for complete search history.

(56) References Cited

U.S. PATENT DOCUMENTS

| | | | | | |
|---|---|---|---|---|---|
| 3,035,237 | A | * | 5/1962 | Schlicke | .................... 333/182 |
| 4,097,708 | A | * | 6/1978 | Bickel | .................... H03B 7/146 219/748 |
| 5,204,644 | A | * | 4/1993 | Dalisda | .................... H03H 7/48 333/127 |
| 5,430,418 | A | * | 7/1995 | Blodgett | .................... 333/100 |
| 5,839,939 | A | * | 11/1998 | Ohi | .................... A63H 3/18 446/175 |
| 5,982,252 | A | * | 11/1999 | Werlau | .................... H01P 5/16 333/127 |
| 6,246,299 | B1 | * | 6/2001 | Werlau | .................... H01P 5/12 333/127 |
| 8,791,772 | B2 | * | 7/2014 | Owen | .................... H03F 3/189 333/127 |
| 2012/0212302 | A1 | * | 8/2012 | Morgenstern | ............. H01P 5/12 333/100 |

FOREIGN PATENT DOCUMENTS

JP 07-263993 10/1995

* cited by examiner

*Primary Examiner* — Robert Pascal
*Assistant Examiner* — Kimberly Glenn
(74) *Attorney, Agent, or Firm* — Greenblum & Bernstein, P.L.C.

(57) ABSTRACT

There is provided a power combiner configured to combine high-frequency powers such that the high-frequency powers respectively input to a plurality of input terminals are output from one output terminal via transmission circuits respectively connected to the input terminals. The respective input terminals are connected to one ends of resistances in parallel with the respective transmission circuits and the other ends of the resistances are connected to each other, so that the input terminals are connected to each other through the resistances connected to the respective input terminals. Each of the transmission circuits is comprised of a circuit in which a first inductor, a transmission section having a constant characteristic impedance and a second inductor are connected to each other in series.

4 Claims, 2 Drawing Sheets

US 9,461,353 B2

POWER COMBINER AND POWER DIVIDER

The disclosure of Japanese Patent Application No. 2013-070842 filed on Mar. 29, 2013, including specification, drawings and claims is incorporated herein by reference in its entirety.

TECHNICAL FIELD

The invention relates to a power combiner configured to combine high-frequency powers such that the high-frequency powers respectively input to a plurality of input terminals are output from one output terminal via transmission circuits respectively connected to the input terminals, and a power divider having an opposite function thereto.

BACKGROUND

FIG. 4 shows an example of a configuration of a power combiner according to the related art. A power combiner 10' according to the related art is configured to combine high-frequency powers such that the high-frequency powers P1 to Pn respectively input to first to n-th input terminals IN1 to INn are output from one output terminal OUT via transmission circuits T1' to Tn' respectively connected to the first to n-th input terminals IN1 to INn.

The first to n-th input terminals IN1 to INn are respectively connected to one ends of resistances R1 to Rn in parallel with the respective corresponding transmission circuits T1' to Tn' and the other ends of the resistances R1 to Rn are connected to each other, so that the input terminals IN1 to INn are connected to each other through the resistances R1 to Rn respectively connected to the input terminals IN1 to INn.

In each of the transmission circuits T1' to Tn', a first inductor (L11 to Ln1) and a second inductor (L12 to Ln2) are connected to each other in series and a connection point of the first inductor and the second inductor is grounded through a capacitor (C1 to Cn).

FIG. 5 shows another example of a configuration of a power combiner according to the related art. FIG. 5 is the same as FIG. 4, except for a configuration of each of transmission circuits T1" to Tn". Specifically, each of the transmission circuits T1" to Tn" is comprised of a first to n-th inductor L1 to Ln, a first capacitor (C11 to Cn1) provided between an input terminal-side of the first to n-th inductor L1 to Ln and an earth, and a second capacitor (C12 to Cn2) provided between an output terminal-side of the first to n-th inductor L1 to Ln and the earth.

Patent Document 1: Japanese Patent Application Publication H07-263993A

A high-frequency power feed system is configured to perform a processing treatment such as plasma etching for an object to be processed such as a semiconductor wafer, a liquid crystal substrate and the like, by using high-frequency power output from a high-frequency power supply device. In the high-frequency power supply device used for such a processing treatment, a plurality of amplifier circuits that outputs high-frequency powers and a power combiner that combines and outputs the high-frequency powers output from the plurality of amplifier circuits are used. If the power combiner as shown in FIG. 4 or FIG. 5 is used for the high-frequency power supply device used such a processing treatment, the high-frequency powers that are input to the input terminals IN1 to INn of the power combiner may become high-power.

In the power combiner as shown in FIG. 4 or FIG. 5, if the high-frequency powers input to the input terminals IN1 to INn become high-power, it is necessary to use a capacitor having excellent withstand voltage characteristics and excellent withstand current characteristics as regards the capacitors used in the transmission circuits T1 to Tn. As the capacitor having excellent withstand voltage characteristics and excellent withstand current characteristics is very expensive, the manufacturing cost of the power combiner is increased. The same can be said for a power divider having an opposite function to that of the power combiner.

SUMMARY

It is therefore an object of the present invention to provide a power combiner and a power divider that can be manufactured at lower cost than the related art.

According to an aspect of the embodiments of the present invention, there is provided a power combiner configured to combine high-frequency powers such that the high-frequency powers respectively input to a plurality of input terminals are output from one output terminal via transmission circuits respectively connected to the input terminals, wherein the respective input terminals are connected to one ends of resistances in parallel with the respective transmission circuits and the other ends of the resistances are connected to each other, so that the input terminals are connected to each other through the resistances connected to the respective input terminals, and wherein each of the transmission circuits is comprised of a circuit in which a first inductor, a transmission section having a constant characteristic impedance and a second inductor are connected to each other in series.

According to another aspect of the embodiments of the present invention, there is provided a power divider configured to divide high-frequency power such that the high-frequency power input to one input terminal is output from a plurality of output terminals via transmission circuits connected to the input terminal, wherein the respective output terminals are connected to one ends of resistances in parallel with the respective transmission circuits and the other ends of the resistances are connected to each other, so that the output terminals are connected to each other through the resistances connected to the respective output terminals, and wherein each of the transmission circuits is comprised of a circuit in which a first inductor, a transmission section having a constant characteristic impedance and a second inductor are connected to each other in series.

In the power combiner or the power divider, the transmission section having the constant characteristic impedance may be a coaxial cable.

In the power combiner or the power divider, the coaxial cable may comprise an internal conductor as a coaxial core, an insulator covering the internal conductor and an external conductor covering the insulator, and the external conductor may be grounded.

According to the invention, it is possible to provide a power combiner and a power divider that can be manufactured at lower cost than the related art.

DETAILED DESCRIPTION OF THE EMBODIMENTS

Figure 1:
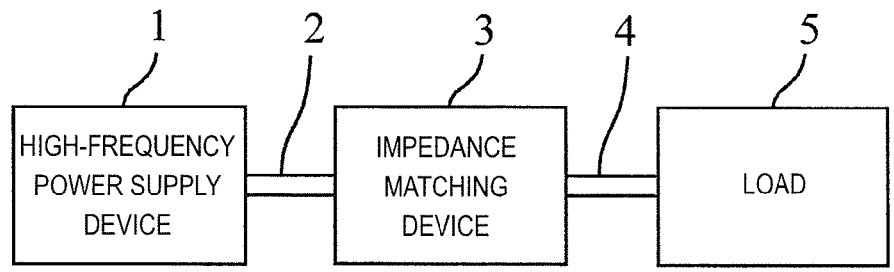
FIG. 1 illustrates an example of a high-frequency power feed system to which a high-frequency power supply device is applied.

Hereinafter, an embodiment of the present invention will be described in detail with reference to the accompanying drawings. In the meantime, the same or equivalent configurations to the related art are denoted with the same reference numerals.

FIG. 1 illustrates an example of a high-frequency power feed system to which a high-frequency power supply device is applied. The high-frequency power feed system is configured to feed traveling wave power to an object to be processed such as a semiconductor wafer, a liquid crystal substrate and the like, thereby performing a processing treatment such as plasma etching. The high-frequency power feed system includes a high-frequency power supply device 1, a transmission line 2, an impedance matching device 3, a load connection part 4 and a load 5. The impedance matching device 3 may not be used in the high-frequency power feed system.

The high-frequency power supply device 1 is configured to amplify a high-frequency signal output from an oscillation part (an oscillator) in a plurality of amplifier circuits (not shown), combine the high-frequency powers with a power combiner 10 (which will be described later) and then outputs the combined high-frequency power as traveling wave power having an output frequency in a wireless frequency band. The traveling wave power output from the high-frequency power supply device 1 is fed to the load 5 through the transmission line 2 comprised of a coaxial cable, the impedance matching device 3 and the load connection part 4 comprised of a shielded copper plate. The high-frequency power that is directed from the high-frequency power supply device towards the load is referred to as the traveling wave power and the high-frequency power that is reflected at the load and is returned towards the high-frequency power supply device is referred to as reflected wave power. The high-frequency power supply device typically outputs the traveling wave power having a frequency of several hundreds kHz (for example, a frequency of 13 MHz, 40 MHz and the like).

The impedance matching device 3 is configured to match impedances of the high-frequency power supply device 1 and the load 5. More specifically, when an impedance (an output impedance) seeing the high-frequency power supply device 1 from an output terminal of the high-frequency power supply device 1 is designed to be 50Ω, for example, and the high-frequency power supply device 1 is connected to an input terminal of the impedance matching device 3 with the transmission line 2 having the characteristic impedance 50Ω, the impedance matching device 3 converts an impedance seeing the load 5 from the input terminal of the impedance matching device 3 into son.

The load 5 is a device that has a processing part and performs processing (etching, CVD and the like) for an object to be processed such as a wafer, a liquid crystal substrate and the like delivered therein. The load 5 introduces a gas for plasma discharge into the processing part and applies the traveling wave power (voltage) which is fed from the high-frequency power supply device 1 to the gas for plasma discharge so as to process the object to be processed, thereby discharging the gas for plasma discharge to thus make the same be under a plasma state from a non-plasma state. Then, the load 5 processes the object to be processed by using the plasma.

Figure 2:
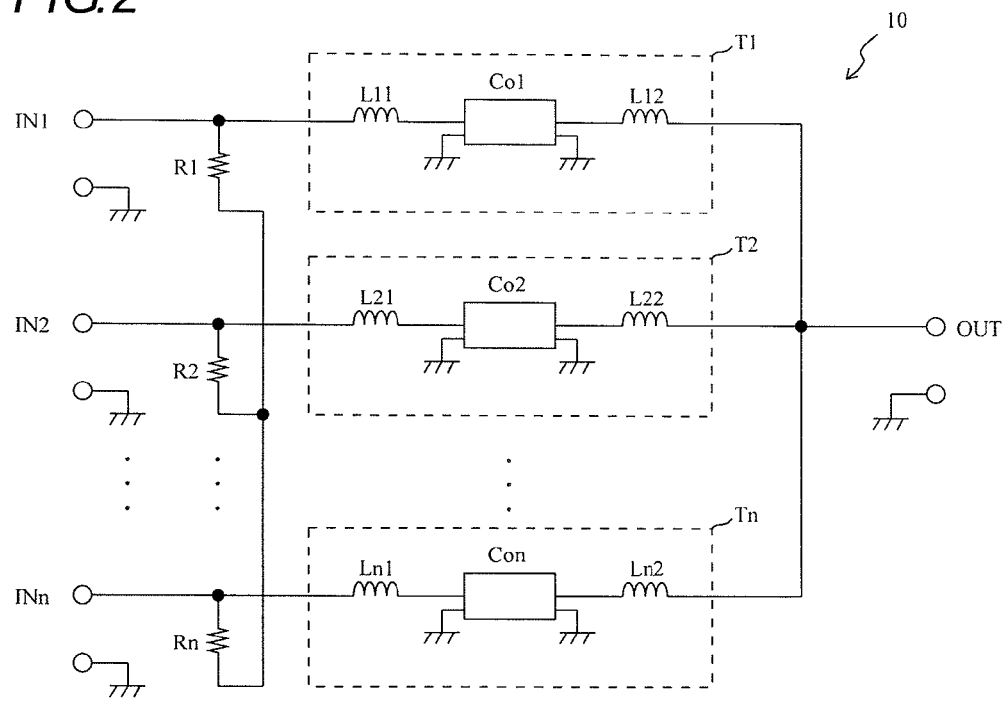
FIG. 2 illustrates an example of a configuration of a power combiner according to an embodiment of the present invention.

FIG. 2 illustrates an example of a configuration of a power combiner 10 according to an illustrative embodiment of the invention. The power combiner 10 is configured to combine high-frequency powers such that the high-frequency powers Pl to Pn respectively input to first to n-th input terminals IN1 to INn are output from one output terminal OUT via first to n-th transmission circuits Tl to Tn respectively connected to the first to n-th input terminals IN1 to INn. Here, n is an integer of 2 or larger.

The first to n-th input terminals IN1 to INn are respectively connected to one ends of resistances Rl to Rn in parallel with the respective corresponding transmission circuits Tl to Tn and the other ends of the resistances Rl to Rn are connected to each other, so that the input terminals IN1 to INn are connected to each other through the resistances Rl to Rn respectively connected to the input terminals IN1 to INn.

Each of the transmission circuits Tl to Tn is comprised of a circuit in which a first inductor (L11 to Ln1), a coaxial cable (Col to Con) and a second inductor (L12 to Ln2) are connected to each other in series.

The coaxial cable (Col to Con) comprises an internal conductor as a coaxial core, an insulator covering the internal conductor and an external conductor covering the insulator. A protective coating covering the external conductor may be provided. Both ends of the external conductor are grounded.

Figure 3:
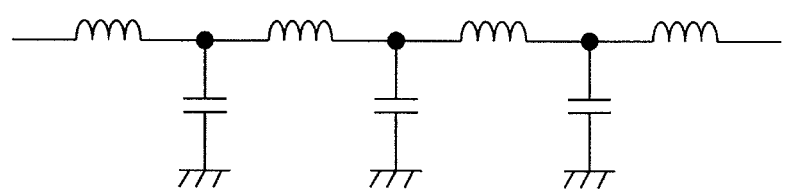
FIG. 3 illustrates an equivalent circuit of a coaxial cable.
Figure 4:
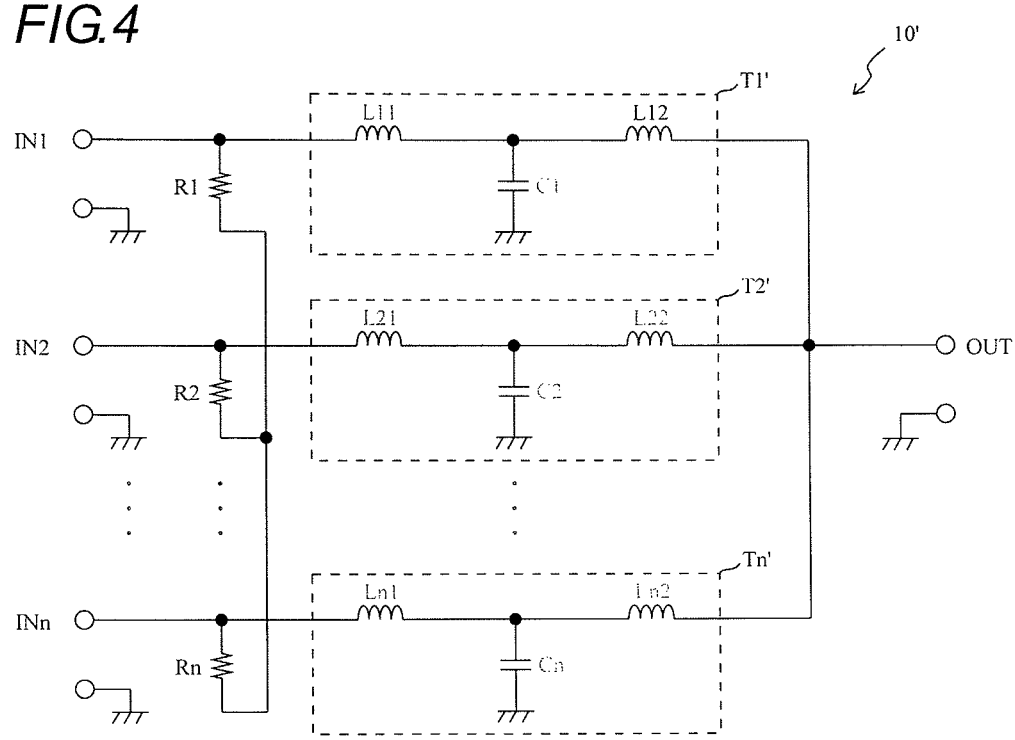
FIG. 4 illustrates an example of a configuration of a power combiner according to the related art.
Figure 5:
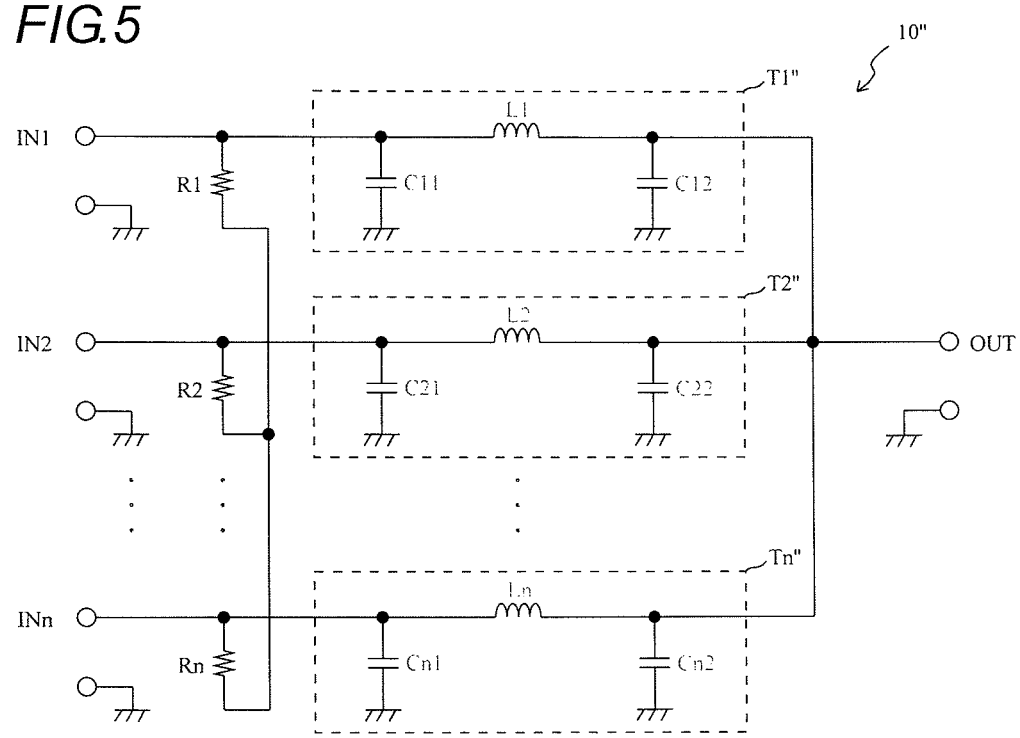
FIG. 5 illustrates another example of a configuration of a power combiner according to the related art.

FIG. 3 illustrates an equivalent circuit of the coaxial cable. As shown in FIG. 3, the coaxial cable is regarded to have a configuration of serially connected inductors and capacitors connected to the earth. That is, like the power combiner of FIG. 4 or FIG. 5, each of the transmission circuits Tl to Tn are substantially provided with the capacitor connected to the earth. For this reason, the transmission circuits Tl to Tn can obtain the same electrical characteristics as the related art even though the high-priced capacitor used in FIG. 4 or FIG. 5 is not used. As the coaxial cable can be obtained at relatively low price, it is possible to reduce the manufacturing cost of the power combiner.

The configuration shown in FIG. 3 is the same configuration as a low-pass filter. Therefore, when the configuration is applied to a circuit requiring the low-pass filter, it is possible to simplify or omit the low-pass filter.

In FIG. 2, the power combiner is described. However, when the output terminal OUT is used as an input terminal and the first to n-th input terminals IN1 to INn are used as first to n-th output terminals, the power combiner can be enabled to function as a power divider. When the power combiner is enabled to function as a power divider, the same effects can be obtained.

In the above embodiment, the coaxial cable is used. However, any member can be used instead of the coaxial member as long as it has the constant characteristic impedance, like the coaxial cable. For example, a microstrip line can be used instead of the coaxial cable.

Also, in the above embodiment, the power combiner and the power divider are used in the high-frequency power supply device 1 shown in FIG. 1. However, the invention is not limited thereto. The invention can be applied to a power combiner and a power divider which are used in the other device using high-frequency power.

What is claimed is:

1. A power combiner configured to combine high-frequency powers such that the high-frequency powers respectively input to a plurality of input terminals are output from one output terminal via transmission circuits respectively connected to the input terminals,
   wherein the respective input terminals are connected to one ends of resistances in parallel with the respective transmission circuits and the other ends of the resistances are connected to each other, so that the input terminals are connected to each other through the resistances connected to the respective input terminals,
   wherein each of the transmission circuits is comprised of a circuit in which a first inductor, a transmission section having a constant characteristic impedance and a second inductor are connected to each other in series, and
   wherein the transmission section having the constant characteristic impedance is a coaxial cable.

2. The power combiner according to claim 1,
   wherein the coaxial cable comprises an internal conductor as a coaxial core, an insulator covering the internal conductor and an external conductor covering the insulator and the external conductor is grounded.

3. A power divider configured to divide high-frequency power such that the high-frequency power input to one input terminal is output from a plurality of output terminals via transmission circuits connected to the input terminal,
   wherein the respective output terminals are connected to one ends of resistances in parallel with the respective transmission circuits and the other ends of the resistances are connected to each other, so that the output terminals are connected to each other through the resistances connected to the respective output terminals,
   wherein each of the transmission circuits is comprised of a circuit in which a first inductor, a transmission section having a constant characteristic impedance and a second inductor are connected to each other in series, and
   wherein the transmission section having the constant characteristic impedance is a coaxial cable.

4. The power divider according to claim 3, wherein the coaxial cable comprises an internal conductor as a coaxial core, an insulator covering the internal conductor and an external conductor covering the insulator and the external conductor is grounded.

* * * * *